United States Patent
Hirochi et al.

(10) Patent No.: US 9,064,695 B1
(45) Date of Patent: Jun. 23, 2015

(54) SUBSTRATE PROCESSING APPARATUS, NON-TRANSITORY COMPUTER-READABLE RECORDING MEDIUM AND METHOD OF MANUFACTURING SEMICONDUCTOR DEVICE

(71) Applicant: Hitachi Kokusai Electric Inc., Tokyo (JP)

(72) Inventors: Yukitomo Hirochi, Toyama (JP); Kazuyuki Toyoda, Toyama (JP); Kazuhiro Morimitsu, Toyama (JP); Taketoshi Sato, Toyama (JP); Tetsuo Yamamoto, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/211,662

(22) Filed: Mar. 14, 2014

Related U.S. Application Data

(63) Continuation of application No. PCT/JP2013/076572, filed on Sep. 30, 2013.

(51) Int. Cl.
| | |
|---|---|
| *H01L 21/00* | (2006.01) |
| *H01L 21/02* | (2006.01) |
| *H01L 21/67* | (2006.01) |
| *H01J 37/32* | (2006.01) |

(52) U.S. Cl.
CPC .... *H01L 21/02263* (2013.01); *H01L 21/67017* (2013.01); *H01J 37/32449* (2013.01); *H01J 37/321* (2013.01); *H01J 37/32357* (2013.01)

(58) Field of Classification Search
CPC .............. H01J 37/321; H01J 37/32357; H01J 37/32449
USPC ................. 118/723 E, 723 I, 723 ER, 723 IR
See application file for complete search history.

(56) References Cited

U.S. PATENT DOCUMENTS 6,908,862 B2 *  6/2005  Li et al. .......................... 438/700

FOREIGN PATENT DOCUMENTS

| JP | 2008211211 A | 9/2008 |
|---|---|---|
| JP | 2009-218262 A | 9/2009 |
| JP | 2010-202985 A | 9/2010 |
| KR | 2008-0012379 A | 2/2008 |

OTHER PUBLICATIONS

Office Action in corresponding Korean Application No. 10-2014-0025782, dated Mar. 5, 2014, along with an English translation.

* cited by examiner

*Primary Examiner* — Richard Booth

(74) *Attorney, Agent, or Firm* — Edell, Shapiro & Finnan LLC

(57) ABSTRACT

There is provided a substrate processing apparatus that alternately supplies a first processing gas and a second processing gas in plasma state to a processing container and processes a substrate. The apparatus includes a first gas supply system configured to supply the first processing gas, a second gas supply system configured to supply the second processing gas, a plasma unit arranged at an upstream side of the processing container to plasmatize at least the second processing gas, and a controller configured to control the first gas supply system and the second gas supply system to alternately supply the first processing gas and the second processing gas and control the plasma unit to apply an electric power to plasmatize the second processing gas before a supply of the second processing gas starts.

8 Claims, 12 Drawing Sheets

<Prior Art>

<Prior Art>

SUBSTRATE PROCESSING APPARATUS, NON-TRANSITORY COMPUTER-READABLE RECORDING MEDIUM AND METHOD OF MANUFACTURING SEMICONDUCTOR DEVICE

CROSS REFERENCE TO RELATED APPLICATIONS

This application is a continuation of International Application No. PCT/JP2013/076572, filed on Sep. 30, 2013, entitled "Substrate Processing Apparatus, Non-Transitory Computer-Readable Recording Medium and Methods of Manufacturing Semiconductor Device," the entire contents of which are hereby incorporated by reference.

FIELD OF THE INVENTION

The present invention relates to a substrate processing apparatus, a non-transitory computer-readable recording medium, and a method of manufacturing a semiconductor device.

BACKGROUND

A substrate processing apparatus using plasma is used in a process of manufacturing a semiconductor device. As the substrate processing apparatus using plasma, for example, a single-wafer-type apparatus disclosed in Japanese Patent Application Publication No. 2008-211211 has been known.

SUMMARY

In a substrate processing apparatus using plasma, in order to improve throughput and precisely define a supply amount or a supply time of a plasma-excited processing gas, it is preferable that plasma be switched on and off at a high speed by being reliably synchronized with a flow of a processing gas.

The present invention provides a substrate processing apparatus, a non-transitory computer-readable recording medium and a method of manufacturing a semiconductor device, capable of switching plasma on and off at a high speed by reliably synchronizing it with a flow of a processing gas.

According to an aspect of the present invention, there is provided a substrate processing apparatus configured to process a substrate by alternately supplying a first processing gas and a second processing gas in plasma state to a processing container, the apparatus including: a first gas supply system configured to supply the first processing gas; a second gas supply system configured to supply the second processing gas; a plasma unit disposed at an upstream side of the processing container and configured to plasmatize at least the second processing gas; and a controller configured to control the first gas supply system and the second gas supply system to alternately supply the first processing gas and the second processing gas, and a power supply of the plasma unit to apply an electric power to plasmatize the second processing gas before a supply of the second processing gas starts According to another aspect of the present invention, there is provided a non-transitory computer-readable recording medium storing a program for processing a substrate by alternately supplying a first processing gas and a second processing gas plasmatized by a plasma unit to a processing container, the program causing a computer to execute: starting a supply of an electric power to plasmatize the second processing gas to the plasma unit without supplying the second processing gas to the plasma unit; and starting a supply of the second processing gas with the electric power being supplied to the plasma unit.

According to still another aspect of the present invention, there is provided a method of manufacturing a semiconductor device by processing a substrate by alternately supplying a first processing gas and a second processing gas plasmatized by a plasma unit to a processing container, the method including: starting a supply of an electric power to plasmatize the second processing gas to the plasma unit without supplying the second processing gas to the plasma unit; and starting a supply of the second processing gas with the electric power being supplied to the plasma unit.

DETAILED DESCRIPTION

First Embodiment

Hereinafter, the first embodiment of the present invention will be described.

(1) Configuration of Substrate Processing Apparatus

First, a substrate processing apparatus according to the first embodiment of the present invention will be described.

Figure 1:
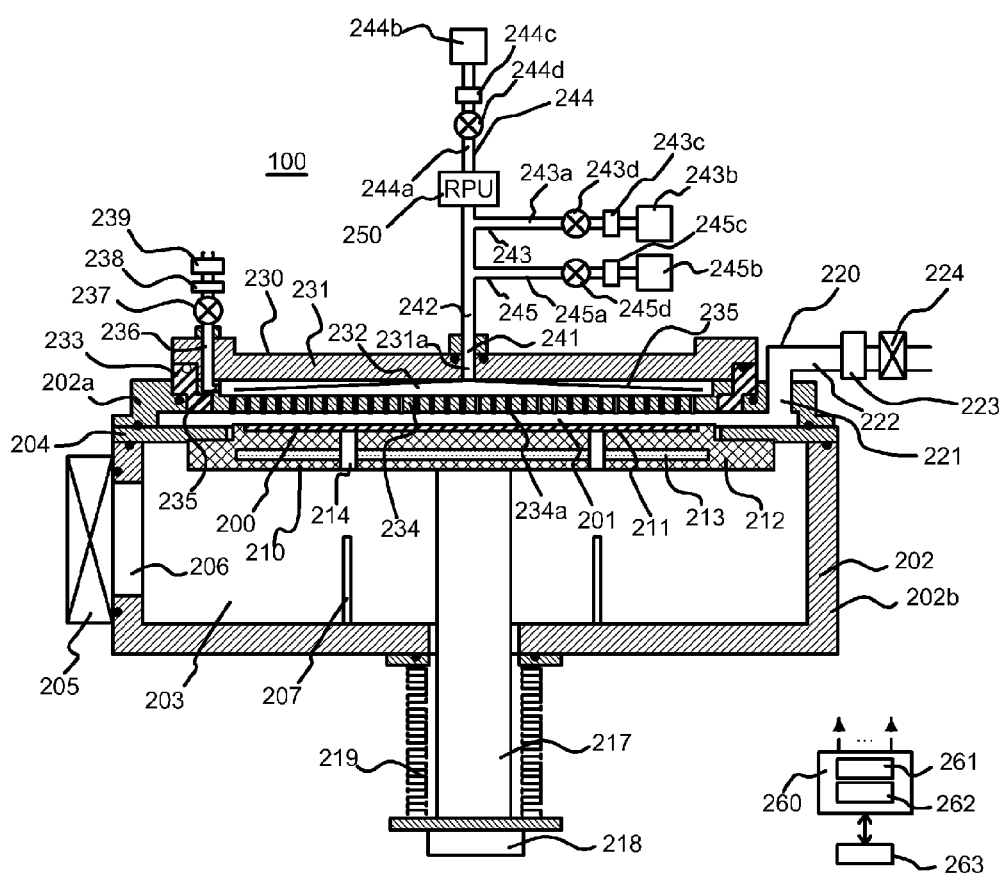
FIG. 1 is a diagram illustrating a substrate processing apparatus according to a first embodiment of the present invention.

FIG. 1 is a diagram illustrating a substrate processing apparatus 100 according to the first embodiment of the present invention. As illustrated, the substrate processing apparatus 100 is configured as a single-wafer-type substrate processing apparatus.

The substrate processing apparatus 100 includes a processing container 202. The processing container 202 is configured as, for example, a flat sealed container having a circular cross section. Also, the processing container 202 is made of a metal material, for example, aluminum (Al) or stainless steel (SUS). A transfer space 203 and a processing space 201 in which a wafer 200 such as a silicon wafer serving as a substrate is processed are formed in the processing container 202. The processing container 202 includes an upper container 202a and a lower container 202b. A partition plate 204 is provided between the upper container 202a and the lower container 202b. The processing space 201 is a space surrounded by the upper container 202a and is located above the partition plate 204. The transfer space 203 is a space surrounded by the lower container 202b and is located below the partition plate.

In a side surface of the lower container 202b, the substrate loading and unloading port 206 adjacent to a gate valve 205 is provided. The wafer 200 moves between a transfer chamber (not illustrated) and the lower container 202b through the substrate loading and unloading port 206. A plurality of lift pins 207 are provided in a bottom of the lower container 202b.

A substrate support 210 supporting the wafer 200 is provided in the processing space 201. The substrate support 210 mainly includes a placing surface 211 on which the wafer 200 is placed, a substrate placing table 212 having the placing surface 211 on a surface thereof, and a heater 213 serving as a heat source included in the substrate placing table 212. In the substrate placing table 212, a plurality of through-holes 214 through which the lift pins 207 pass are respectively provided in corresponding positions of the lift pins 207.

The substrate placing table 212 is supported by a shaft 217. The shaft 217 passes through a bottom of the processing container 202 and is connected to a lift mechanism 218 outside the processing container 202. The lift mechanism 218 is operated to elevate the shaft 217 and the substrate placing table 212 so that the wafer 200 placed on the substrate placing surface 211 may be elevated. In addition, a low portion of the shaft 217 is covered by a bellows 219 and thereby an inside of the processing space 201 is maintained in an airtight state.

When the wafer 200 is transferred, in the substrate placing table 212, the substrate placing surface 211 is lowered to the same height (a wafer transfer position) as that of the substrate loading and unloading port 206. When the wafer 200 is processed, as illustrated in FIG. 1, the wafer 200 is elevated to a processing position (a wafer processing position) in the processing space 201.

Specifically, when the substrate placing table 212 is lowered to the wafer transfer position, an upper end portion of the lift pins 207 protrudes from a top surface of the substrate placing surface 211, and the lift pins 207 supports the wafer 200 from a lower portion. Also, when the substrate placing table 212 is elevated to the wafer processing position, the lift pins 207 are buried from the top surface of the substrate placing surface 211, and the substrate placing surface 211 supports the wafer 200 from a lower portion. In addition, it is preferable that the lift pins 207 be made of a material such as silica or alumina in order to come in contact with the wafer 200.

Exhaust System

In a side surface of an inner wall of the processing space 201 (the upper container 202a), an exhaust port 221 for exhausting atmosphere of the processing space 201 is provided. An exhaust pipe 222 is connected to the exhaust port 221. In the exhaust pipe 222, a pressure regulator 223 such as an auto pressure controller (APC) controlling an inside of the processing space 201 at a predetermined pressure and a vacuum pump 224 are sequentially connected in series. Mainly, an exhaust system 220 includes the exhaust port 221, the exhaust pipe 222, the pressure regulator 223, and the vacuum pump 224.

Gas Introduction Port

In a top surface (a ceiling wall) of a shower head 230 to be described that is provided above the processing space 201, a gas introduction port 241 is provided to supply various gases in the processing space 201. A gas supply system is connected to the gas introduction port 241. A configuration of the gas supply system will be described below.

Shower Head

The shower head 230 serving as a gas dispersion mechanism is provided between the gas introduction port 241 and the processing space 201. The gas introduction port 241 is connected to a lid 231 of the shower head 230. A gas introduced from the gas introduction port 241 is supplied to a buffer space 232 of the shower head 230 through a hole 231a provided in the lid 231.

The lid 231 of the shower head is made of, for example, a metal. An insulating block 233 is provided between the lid 231 and the upper container 202a and insulates a gap between the lid 231 and the upper container 202a.

In the shower head 230, a dispersion plate 234 dispersing a gas introduced from the gas introduction port 241 is provided between the buffer space 232 and the processing space 201. The dispersion plate 234 is arranged so as to face the substrate placing surface 211. In addition, a plurality of through-holes 234a are formed in the dispersion plate 234.

A gas guide 235 forming a flow of a supplied gas is provided in the buffer space 232. The gas guide 235 has a conical shape with a hole 231a as a vertex and whose diameter increases toward the dispersion plate 234.

An exhaust pipe 236 is connected to a side of the buffer space 232. In the exhaust pipe 236, a valve 237 switching exhaust on and off, a pressure regulator 238 such as an auto pressure controller (APC) controlling an inside of the exhaust buffer space 232 at a predetermined pressure, and a vacuum pump 239 are sequentially connected in series.

Gas Supply System

As described above, the gas supply system is connected to the gas introduction port 241. The gas supply system includes a common gas supply pipe 242, a first gas supply system 243, a second gas supply system 244, a third gas supply system 245, and a remote plasma unit (RPU) 250. The common gas supply pipe 242 is connected to the gas introduction port 241. In the common gas supply pipe 242, the first gas supply system 243 and the third gas supply system 245 are connected, and the second gas supply system 244 is connected through the remote plasma unit 250.

First Gas Supply System 243

In a gas supply pipe 243a of the first gas supply system 243, in order from an upstream end, a gas supply source 243b, a mass flow controller (MFC) 243c serving as a flow rate controller (a flow rate control unit), and a valve 243d serving as an on-off valve are provided.

A gas that contains a first element (hereinafter referred to as a "first-element-containing gas") is stored in the gas supply source 243b. The first-element-containing gas passes the mass flow controller 243c and the valve 243d, which are provided in the gas supply pipe 243a, is introduced into the common gas supply pipe 242, and is supplied to the processing container 202 through the shower head 230.

The first-element-containing gas is a source gas, that is, one of processing gases. Here, the first element is, for example, a metal element, and the first-element-containing gas is a metal-containing gas. In the present embodiment, titanium (Ti) is used as the metal element. For example, TDMAT (Tetrakis-Dimethyl-Amino-Titanium: Ti[N(CH$_3$)$_2$]$_4$) gas may be used as a titanium-containing gas. Also, the TDMAT may be a liquid source. For example, a vaporizer (not illustrated) is provided as a component of the gas supply source 243b, the vaporizer vaporizes the liquid source and thereby the liquid source may be used as a gas source.

Also, TiCl$_4$ and the like may be used as the titanium-containing gas. In addition, the metal element is not limited to titanium but may include other elements such as tungsten (W), tantalum (Ta), zirconium (Zr), hafnium (Hf), ruthenium (Ru), cobalt (Co), and nickel (Ni). Further, the first-element-containing gas is not limited to the metal-containing gas but may include a silicon-containing gas and the like.

Second Gas Supply System 244

In a gas supply pipe 244a of the second gas supply system 244, in order from an upstream end, a gas supply source 244b, a mass flow controller (MFC) 244c serving as a flow rate controller (a flow rate control unit), and a valve 244d serving as an on-off valve are provided.

A gas that contains a second element (hereinafter referred to as a "second-element-containing gas") is stored in the gas supply source 243b. The second-element-containing gas passes the mass flow controller 244c and the valve 244d, which are provided in the gas supply pipe 244a, and is supplied to the remote plasma unit 250. The second-element-containing gas supplied to the remote plasma unit 250 is plasma-excited when passing the remote plasma unit 250. The plasma-excited second-element-containing gas is introduced into the common gas supply pipe 242 and is supplied to the processing container 202 through the shower head 230.

The second-element-containing gas is one of processing gases. Also, the second-element-containing gas may also be considered as a reaction gas or a reformed gas.

Here, the second-element-containing gas is an oxygen-containing gas serving as an oxidizing agent and includes the element oxygen (O). In the present embodiment, oxygen ($O_2$) gas is used as the oxygen-containing gas. Also, the second-element-containing gas is not limited to the oxygen-containing gas but may include a nitrogen-containing gas serving as a nitriding agent, for example, ammonia ($NH_3$). Further, other gases that can be activated by the plasma may also be used as the second-element-containing gas.

Third Gas Supply System 245

In a gas supply pipe 245a of the third gas supply system 245, in order from an upstream end, a gas supply source 245b, a mass flow controller (MFC) 245c serving as a flow rate controller (a flow rate control unit), and a valve 245d serving as an on-off valve are provided.

An inert gas is stored in the gas supply source 245b. The inert gas passes the mass flow controller 245c and the valve 245d, which are provided in the gas supply pipe 245a, is introduced into the common gas supply pipe 242, and is supplied to the processing container 202 through the shower head 230.

In the present embodiment, nitrogen ($N_2$) gas is used as the inert gas. Also, in addition to $N_2$ gas, noble gases such as helium (He) gas, neon (Ne) gas, and argon (Ar) gas may be used as the inert gas.

Remote Plasma Unit 250

As the remote plasma unit 250, for example, an inductively coupled plasma (ICP) apparatus may be used.

The ICP apparatus includes a dielectric coil and a high-frequency power supply supplying an electric power thereto. When the electric power is supplied from the high-frequency power supply to the dielectric coil, if impedance of the remote plasma unit 250 is matched (for example, impedance of the remote plasma unit 250 is 50Ω or a value in the vicinity thereof), the plasma is generated (ignited), and the gas supplied to the remote plasma unit 250 is plasmatized. A matching state (impedance) of the remote plasma unit 250 is changed according to gas atmosphere (such as a gas type or a pressure) in a space inside the remote plasma unit 250. Also, the remote plasma unit 250 is not limited to the ICP apparatus but may include an electron cyclotron resonance (ECR) apparatus, capacitively coupled plasma (CCP), and the like.

Controller

The substrate processing apparatus 100 includes a controller 260 that controls an operation of each unit of the substrate processing apparatus 100. The controller 260 includes at least a calculating unit 261 and a storage unit 262. The controller 260 calls a program or a recipe from the storage unit according to an instruction of the controller or a user and controls each configuration in response to content thereof.

In addition, the controller 260 may be configured as a dedicated computer and may also be configured as a general-purpose computer. For example, an external memory device 263 (for example, a magnetic tape, a magnetic disk such as a flexible disk and a hard disk, an optical disc such as a CD and a DVD, a magneto-optical disc such as an MO, and a semiconductor memory such as a USB memory (USB Flash Drive) and a memory card) storing the aforementioned program is prepared and the program is installed in the general-purpose computer using the external memory device 263 so that the controller 260 according to the present embodiment may be configured.

In addition, a unit for providing the program to the computer is not limited to providing the program through the external memory device 263. For example, the program may also be provided using a communication unit such as the Internet or a dedicated line without the external memory device 263. Also, the storage unit 262 or the external memory device 263 is configured as a computer readable recording medium. Hereinafter, these are also collectively and simply called a recording medium. In addition, when the term "recording medium" is used in this specification, it refers to only the storage unit 262, only the external memory device 263, or both.

(2) Substrate Processing Process

Next, a process of forming a thin film on the wafer 200 in the substrate processing apparatus 100 will be described.

Figure 2:
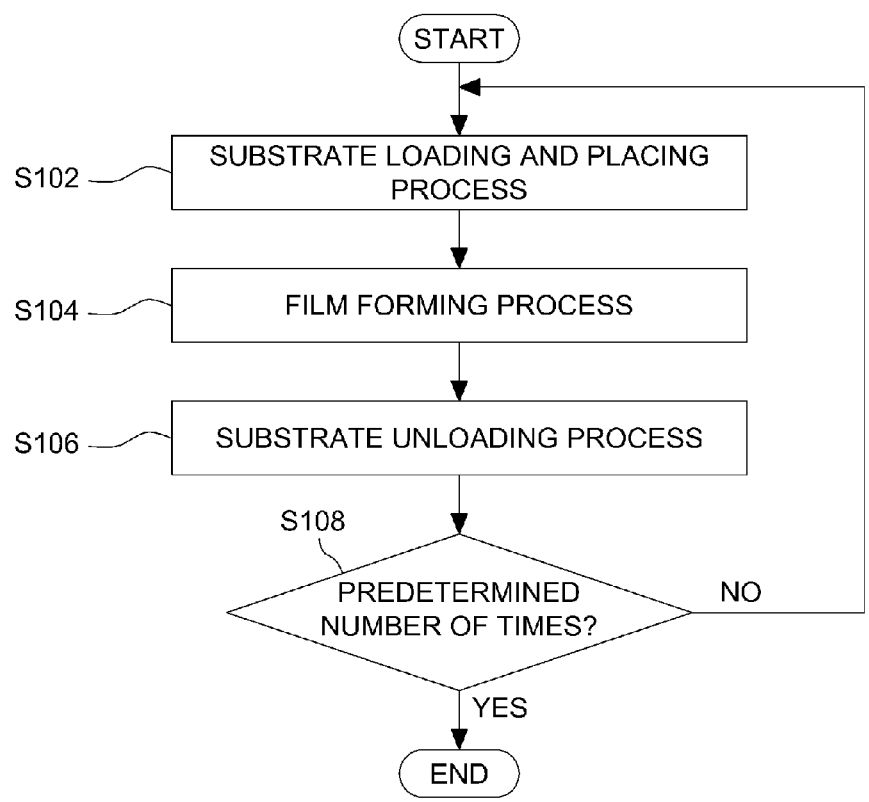
FIG. 2 is a flowchart illustrating a substrate processing process according to the first embodiment of the present invention.

FIG. 2 is a flowchart illustrating a substrate processing process according to the first embodiment of the present invention. Also, in the following description, operations of each unit constituting the substrate processing apparatus 100 are controlled by the controller 260.

In the present embodiment, an example in which the aforementioned TDMAT gas and plasmatized $O_2$ gas are alternately supplied and a $TiO_2$ film serving as a high dielectric constant insulating film is formed on the wafer 200 will be described. In addition, a predetermined film may also be formed on the wafer 200 in advance. A predetermined pattern may also be formed on the wafer 200 or on the predetermined film in advance.

Substrate Loading and Placing Process (S102)

First, in the substrate processing apparatus 100, the substrate placing table 212 is lowered to a transfer position of the wafer 200 so that the lift pins 207 pass through the through-hole 214 of the substrate placing table 212. As a result, the lift pins 207 protrude from a surface of the substrate placing table 212 by only a predetermined height. Subsequently, the gate valve 205 is opened, the wafer 200 is loaded in the transfer space 203 of the processing container 202 and the wafer 200 is transferred on the lift pins 207 using a wafer transfer device (not illustrated). Therefore, the wafer 200 is horizontally supported in a horizontal posture on the lift pins 207 protruding from the surface of the substrate placing table 212.

After the wafer 200 is loaded in the transfer space 203, the wafer transfer device is evacuated to the outside of the processing container 202, the gate valve 205 is closed, and the processing container 202 is sealed. Then, the substrate placing table 212 is elevated such that the wafer 200 is placed on the substrate placing surface 211 of the substrate placing table 212.

In addition, when the wafer 200 is loaded in the transfer space 203, it is preferable that $N_2$ gas serving as an inert gas be supplied in the processing container 202 from the third gas supply system while an inside of the processing container 202 is exhausted using the exhaust system. That is, it is preferable that $N_2$ gas be provided in the processing container 202 by opening at least the valve 245d of the third gas supply system while the vacuum pump 224 is operated and an APC valve 223 is opened and thereby the inside of the processing container 202 is exhausted. Accordingly, it is possible to suppress particles from entering the processing container 202 or adhering to the wafer 200. Also, the vacuum pump 224 is always operated at least during the substrate loading and placing process (S102) to a substrate unloading process (S106) to be described.

When the wafer 200 is placed on the substrate placing table 212, an electric power is supplied to the heater 213 embedded inside the substrate placing table 212 and a surface of the wafer 200 is controlled to a predetermined temperature. The temperature of the wafer 200 is, for example, in a range of room temperature or more and 500° C. or less, and preferably, room temperature or more and 400° C. or less. A temperature of the heater 213 is adjusted by controlling electricity to the heater 213 based on information on a temperature detected by a temperature sensor (not illustrated).

Film-Forming Process (S104)

Next, a process of forming a film (thin film formation) (S104) is performed. The film-forming process (S104) will be described below.

Substrate Unloading Process (S106)

Next, the substrate placing table 212 is lowered and the wafer 200 is supported on the lift pins 207 protruding from the surface of the substrate placing table 212. Then, the gate valve 205 is opened and the wafer 200 is unloaded outside the processing container 202 using the wafer transfer device.

Processing Number Determining Process (S108)

After the wafer 200 is unloaded, it is determined whether the film-forming process has been performed a predetermined number of times. When it is determined that the film-forming process has been performed the predetermined number of times, the substrate processing process is terminated. Also, before the substrate processing process is terminated, a cleaning process may be performed. On the other hand, when it is determined that the film-forming process has not been performed the predetermined number of times, the process returns to the substrate loading and placing process (S102) in order to start processing of the wafer 200 that is waiting for the next.

(3) Film-Forming Process

Next, the film-forming process (S104) will be described.

Figure 3:
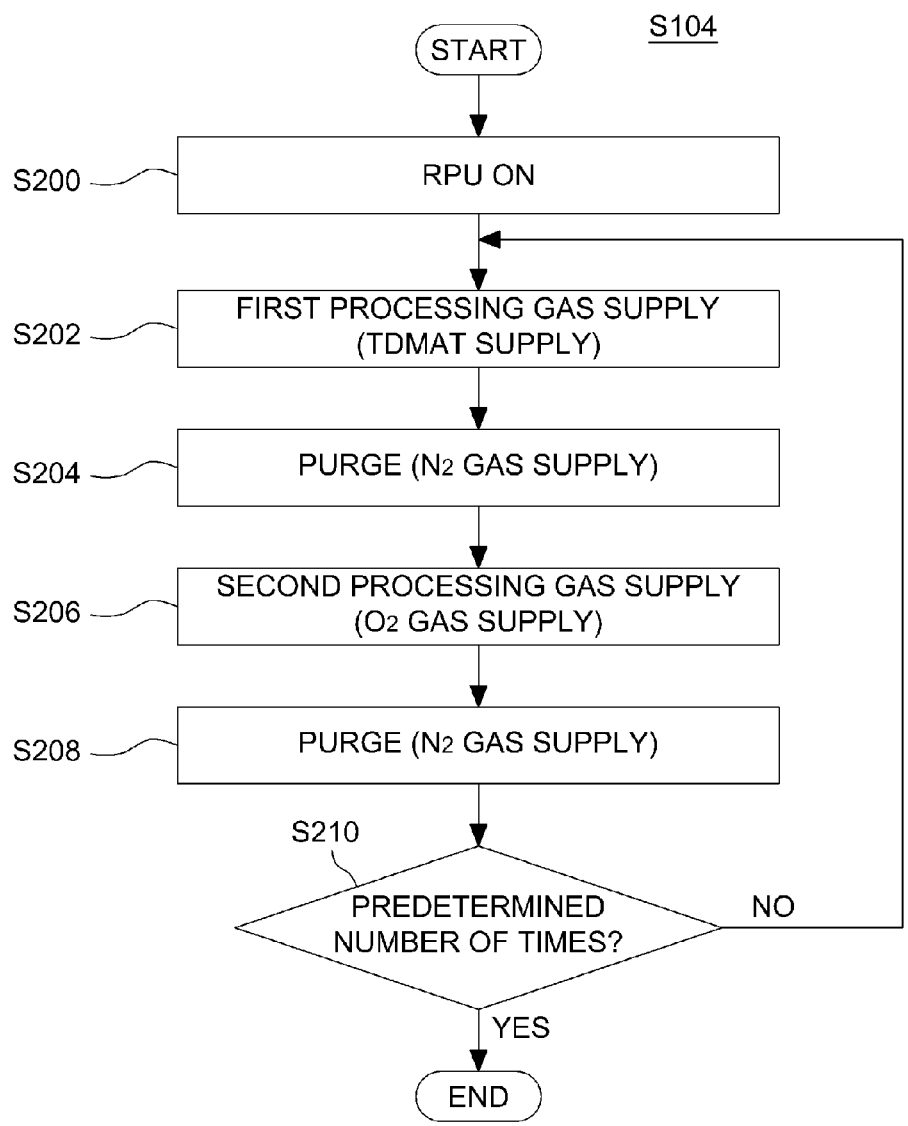
FIG. 3 is a flowchart illustrating a film-forming process according to the first embodiment of the present invention.

FIG. 3 is a flowchart illustrating a film-forming process according to the first embodiment of the present invention and is a detailed flowchart of the film-forming process in the flowchart illustrated in FIG. 2. Hereinafter, details of the film-forming process (S104) will be described with reference to FIG. 3.

Remote Plasma Unit on Process (S200)

Before supply of various gases, the remote plasma unit 250 is turned on. Here, the term "on" of the remote plasma unit 250 means that a constant power is applied to the dielectric coil from a high-frequency power supply in the remote plasma unit 250. In addition, the term "constant power" specifically refers to an electric power necessary for plasmatization (plasma ignition) of $O_2$ gas. When the remote plasma unit 250 is turned on, if the impedance of the remote plasma unit 250 is matched, the plasma is ignited, and otherwise, no plasma is ignited.

Here, determination of whether the impedance is matched in the remote plasma unit 250 and the plasma is actually ignited and generated depends on a gas type or a gas flow rate, and a pressure, a temperature, and the like in the space inside the remote plasma unit 250 when the power is constant. In the present invention, the impedance is matched and the plasma is generated only when $O_2$ gas is supplied (passing) to the space inside the remote plasma unit 250. In other words, a supply condition of the TDMAT gas, $N_2$ gas and $O_2$ gas is set such hat, when the remote plasma unit 250 is turned on, if the TDMAT gas (and/or $N_2$ gas) passes the remote plasma unit 250, the impedance is not matched and thereby no plasma is generated, and when $O_2$ gas passes, the impedance is matched and thereby the plasma is generated. This supply condition includes at least a flow rate, and preferably includes other parameters (such as a pressure of the processing space 201) having an influence on the pressure in the space inside the remote plasma unit 250, a temperature, and the like. In addition, for example, the applied power to the remote plasma unit 250 may be set such that, even when the TDMAT gas is supplied, no plasma is generated, and the plasma is generated only when $O_2$ gas is supplied.

First Processing Gas Supply Process (S202)

When the wafer 200 is heated and reaches a desired temperature, the valve 243d is opened and supply of the TDMAT gas in the processing space 201 of the processing container 202 starts.

At this time, the mass flow controller 243c is adjusted such that a flow rate of the TDMAT gas reaches a predetermined flow rate. Also, a supply flow rate of the TDMAT gas is set to, for example, 1 sccm or more and 100 sccm or less. In addition, a degree of valve opening of the APC valve 223 is adjusted so that a pressure in the processing container 202 is controlled to a predetermined pressure. Further, an inert gas supply system is connected to the first gas supply system 243 and $N_2$ gas serving as a carrier gas may be flowed along the TDMAT gas. Also, in order to prevent a vaporized TDMAT from being liquefied, the first gas supply system 243 is controlled to a predetermined temperature and thereby the TDMAT gas may be maintained at a predetermined vaporization temperature.

In addition, the first gas supply system 243 is arranged at a downstream side of the remote plasma unit 250. However, even when the TDMAT gas is dispersed in the remote plasma unit 250 through the common gas supply pipe 242, no TDMAT gas is plasmatized in the remote plasma unit 250 as described above.

The TDMAT gas supplied to the processing container 202 is supplied onto the wafer 200. A metal-containing layer (a titanium-containing layer) serving as a "first-element-containing layer" is formed on a surface of the wafer 200 due to contacts of the TDMAT gas.

The metal-containing layer is formed to have a predetermined thickness and a predetermined distribution according to, for example, a pressure in the processing container 202, a flow rate of the TDMAT gas, a temperature of a susceptor 217, and a time (a process time) taken for passing the TDMAT gas through the processing space 201.

When the TDMAT gas is supplied for a predetermined time, the valve 243d is closed and supply of the TDMAT gas is terminated.

Purge Process (S204)

After the first processing gas supply process (S202) is performed, the valve 245d is opened and $N_2$ gas is supplied to the processing space 201 of the processing container 202. At this time, as described above, according to operations of the vacuum pump 224 and the APC valve 223, the inside of the processing container 202 is exhausted. Accordingly, $N_2$ gas supplied to the processing container 202 removes a redundant TDMAT (that which does not contribute to film formation) gas supplied in the first processing gas supply process (S202) from the wafer 200 and discharges the redundant TDMAT gas from the processing container 202. In addition, the valve 237 is opened and a pressure regulator 238 and a vacuum pump 239 are controlled so that the TDMAT gas remaining in the shower head 230 is also removed. Then, when purge is performed for a predetermined time, the valve 245d is closed, supply of $N_2$ gas is stopped, the valve 237 is opened, and a gap between the shower head 230 and the vacuum pump 239 is blocked. Also, a supply flow rate of $N_2$ gas is set to, for example, 0.1 sccm or more and 10 sccm or less.

In addition, a supply condition of $N_2$ gas is set such that, when the remote plasma unit 250 is turned on, no plasma is generated even if $N_2$ gas passes the remote plasma unit 250. The third gas supply system 245 is arranged at a downstream side of the remote plasma unit 250. However, even when $N_2$ gas is dispersed in the remote plasma unit 250 through the common gas supply pipe 242, since the supply condition of $N_2$ gas is set as described above, no $N_2$ gas is plasmatized in the remote plasma unit 250.

Second Processing Gas Supply Process (S206)

After the purge process (S204) is performed, the valve 244d is opened, $O_2$ gas is plasma-excited in the remote plasma unit 250, and this plasmatized $O_2$ gas is supplied to the processing space 201.

At this time, the mass flow controller 244c is adjusted such that a flow rate of $O_2$ gas reaches a predetermined flow rate. Also, a supply flow rate of $O_2$ gas is set to, for example, 0.1 sccm or more and 10 sccm or less. In addition, a degree of valve opening of the APC valve 223 is appropriately adjusted so that a pressure in the processing container 202 is controlled to a predetermined pressure. Also, the inert gas supply system is connected to the second gas supply system 244 and $N_2$ gas serving as a carrier gas may flow along with $O_2$ gas.

Since the remote plasma unit 250 is already turned on and application of an electric power for plasmatizing $O_2$ gas starts in the aforementioned remote plasma unit on process (S200), when $O_2$ gas is supplied to the remote plasma unit 250 and the impedance is matched, the plasma is rapidly ignited and generated.

$O_2$ gas plasmatized by the remote plasma unit 250 is supplied onto the wafer 200 through the shower head 230. The already formed metal-containing layer (a titanium-containing layer) is modified (oxidized) by the plasma of this $O_2$ gas so that a metal oxide film (a $TiO_2$ film) is formed on the wafer 200.

The metal oxide film serving as a modifying layer is formed to have a predetermined thickness, a predetermined distribution, and a penetration depth of a predetermined oxygen component to the metal-containing layer according to, for example, the pressure in the processing container 202, the flow rate of $O_2$ gas, a temperature of the substrate placing table 212, and supply an electric power of the remote plasma unit 250.

When $O_2$ gas is supplied for a predetermined time, the valve 244d is closed and supply of $O_2$ gas is terminated. At this time, when the supply of $O_2$ gas to the remote plasma unit 250 is terminated, the impedance matching is broken and the plasma is rapidly extinguished (lost).

Purge Process (S208)

After the second processing gas supply process (S206) is performed, the valve 245d is opened and $N_2$ gas is supplied to the processing space 201 of the processing container 202. $N_2$ gas supplied to the processing container 202 removes a redundant $O_2$ gas (that which has not contributed to film formation) supplied in the second processing gas supply process (S206) from the wafer 200 and discharges the redundant $O_2$ gas from the processing container 202. In addition, the valve 237 is opened and the pressure regulator 238 and the vacuum pump 239 are controlled so that $O_2$ gas remaining in the shower head 230 is also removed. Then, when purge is performed for a predetermined time, the valve 245d is closed, supply of $N_2$ gas is stopped, the valve 237 is closed, and a gap between the shower head 230 and the vacuum pump 239 is blocked. Also, a supply flow rate of $N_2$ gas is set to, for example, 0.1 sccm or more and 10 sccm or less.

In addition, as in the aforementioned purge process (S204), the supply condition of $N_2$ gas is set such that, when the remote plasma unit 250 is turned on, no plasma is generated even if $N_2$ gas is supplied to the remote plasma unit 250. Therefore, even when $N_2$ gas is dispersed in the remote plasma unit 250 through the common gas supply pipe 242, no $N_2$ gas is plasmatized in the remote plasma unit 250.

Determining Process (S210)

Subsequently, the controller 260 determines whether a cycle including the aforementioned S202 to S208 is performed a predetermined number of times. When this cycle has not been performed the predetermined number of times (No in S210), the process returns to the first processing gas supply process (S202) and the film-forming process is repeated. When this cycle has been performed the predetermined number of times (Yes in S210), the film-forming process is terminated. In this case, the remote plasma unit 250 is turned off and application of the electric power may be stopped.

Figure 4:
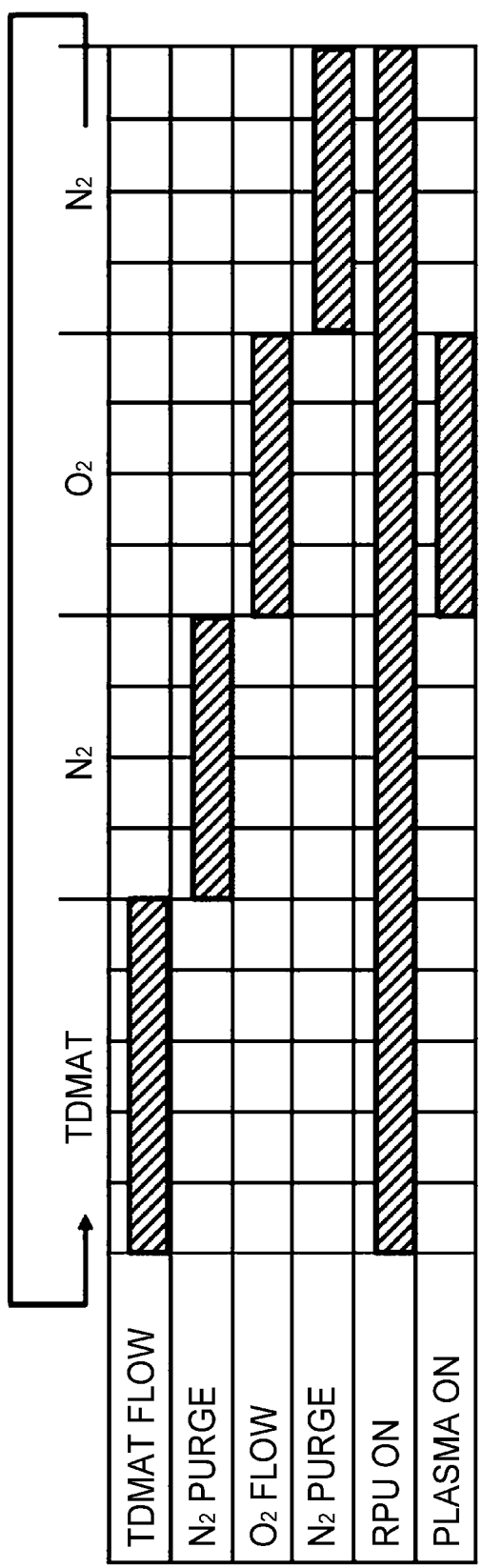
FIG. 4 is a time chart of the film-forming process illustrated in FIG. 3.
Figure 5:
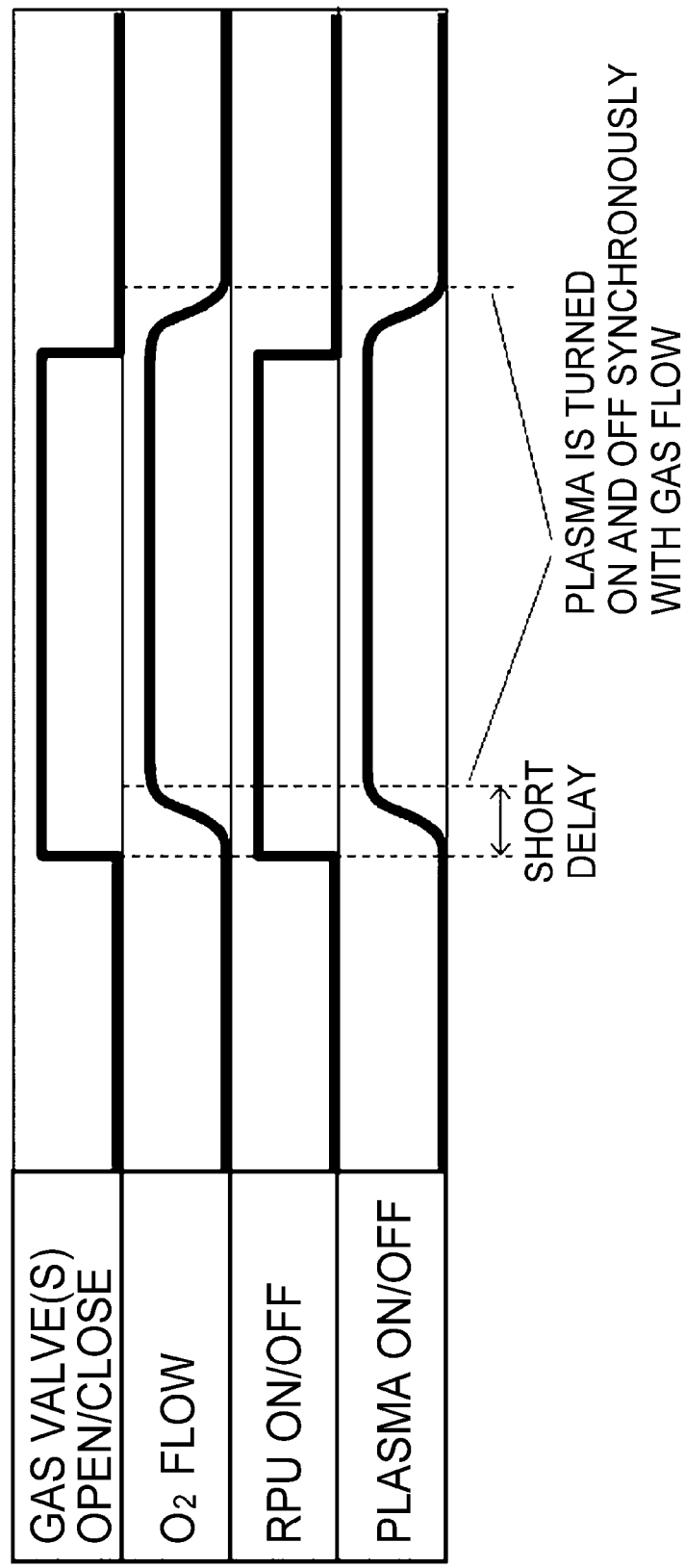
FIG. 5 is a time chart illustrating a timing of plasma ignition in the film-forming process illustrated in FIG. 3.

The aforementioned processes will be described again with reference to FIGS. 4, 5, 11 and 12. FIG. 4 is a time chart illustrating a timing of plasma ignition in the film-forming process illustrated in FIG. 3. FIG. 5 is a time chart illustrating a timing of plasma ignition in the film-forming process illustrated in FIG. 3. Also, FIG. 11 is a time chart illustrating a film-forming process in the related art, and FIG. 12 is a time chart illustrating a timing of plasma ignition in the film-forming process illustrated in FIG. 11.

As illustrated in FIG. 4, the remote plasma unit 250 is always turned on while the film-forming process is performed. However, as described above, when the TDMAT gas is supplied (TDMAT Flow) and $N_2$ gas is supplied ($N_2$ Purge), no plasma is ignited, and the plasma is ignited only when $O_2$ gas is supplied.

A timing of plasma ignition and plasma extinguishing will be described with reference to FIG. 5. As illustrated in. FIG. 5, since the remote plasma unit 250 is always turned on, when the valve 244d of the second gas supply system 244 is opened, supply of $O_2$ gas starts, and the flow rate of $O_2$ gas becomes a predetermined flow rate, the impedance is matched and the plasma is ignited (plasma on). In addition, when the valve 244d of the second gas supply system 244 is closed and the flow rate of $O_2$ gas is below the predetermined flow rate, the impedance matching is broken and the plasma is extinguished (plasma off). In this way, in the present invention, it is possible to switch plasma on and off at a high speed by securely synchronizing it with a flow of the processing gas (a flow rate, or, presence or absence of a processing gas).

Figure 11:
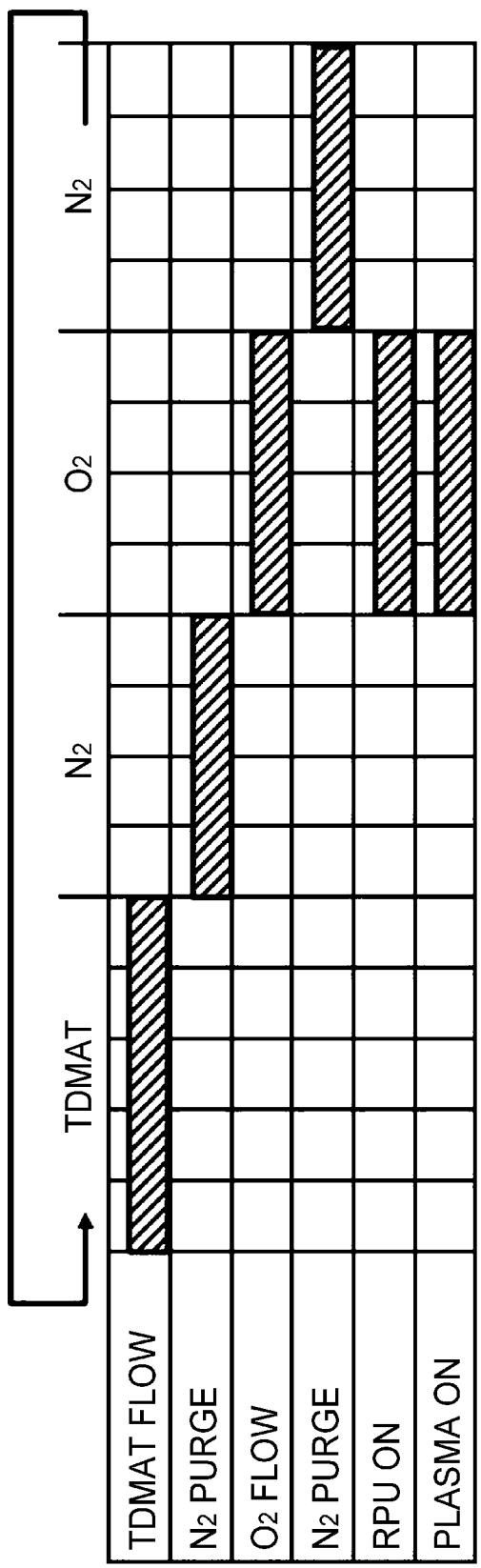
FIG. 11 is a time chart illustrating a film-forming process in the related art.
Figure 12:
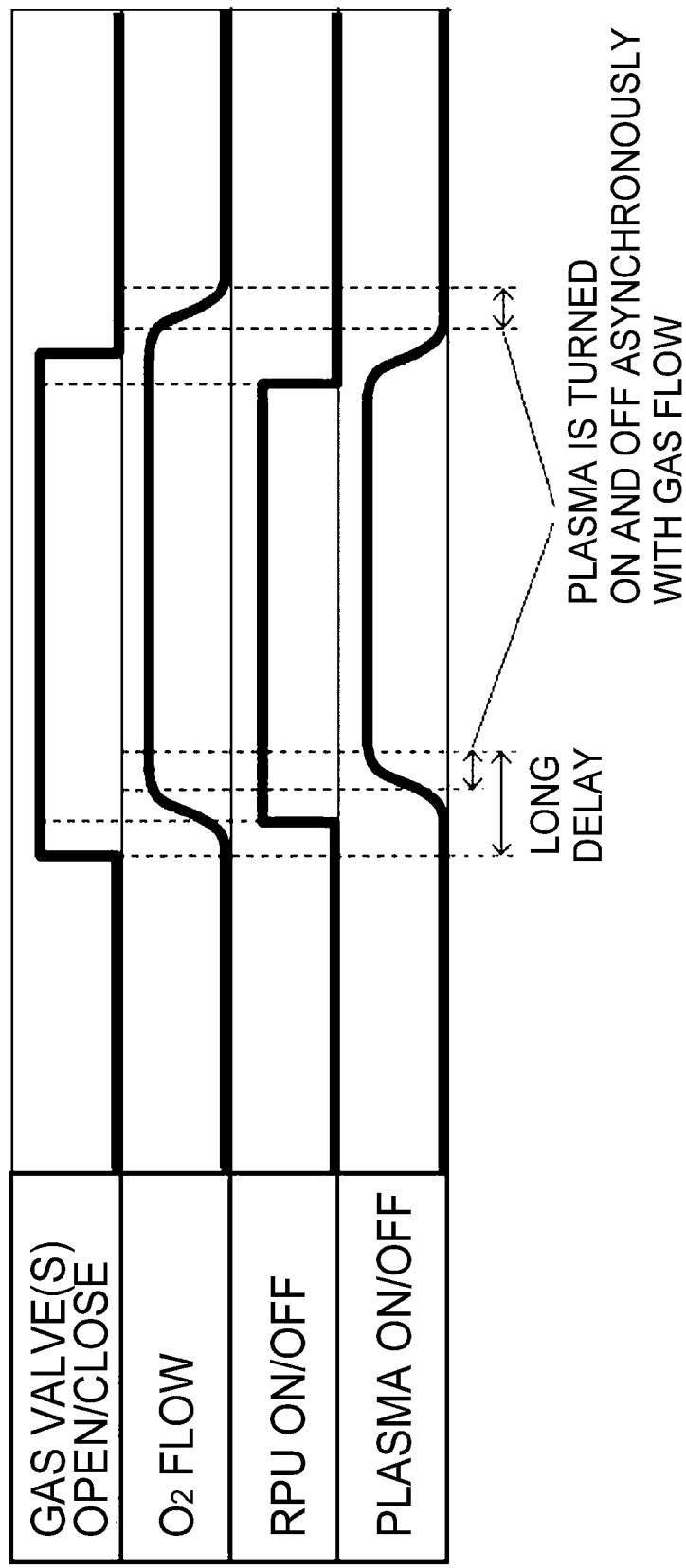
FIG. 12 is a time chart illustrating a timing of plasma ignition in the film-forming process illustrated in FIG. 11.

On the other hand, in the related art, as illustrated in FIG. 11, on and off operations of a remote plasma unit are generally controlled by synchronizing with supply of a processing gas. However, it is difficult to precisely match the on and off operations of the remote plasma unit with an operation of a valve configured to supply and stop the processing gas.

Therefore, it is difficult to securely synchronize plasma on and off with a flow of the processing gas. For example, as illustrated in FIG. 12, when an on timing of the remote plasma unit is later than a start timing of supplying the processing gas, an amount of delay until the plasma is actually ignited increases. Also, when an off timing of the remote plasma unit is earlier than an end timing of supplying the processing gas, the plasma is extinguished and a remaining processing gas may not be plasmatized.

As described above, in the present invention, since the remote plasma unit 250 is always turned on (a state in which an electric power necessary for plasmatizing a gas is applied), plasma generation may be controlled by only opening and closing the valve 244$d$ configured to supply and stop $O_2$ gas. Therefore, it is possible to implement plasma on and off that is securely synchronized with the flow of the processing gas. Further, since the plasma generation is controlled by only the flow rate of the processing gas or presence or absence of the processing gas, it is possible to switch plasma on and off at a high speed. As a result, it is possible to improve throughput and precisely define a supply amount or a supply time of the plasmatized processing gas. Moreover, since there is no need to control the remote plasma unit 250 by synchronizing it with supply of the processing gas, it is also possible to simplify control in the controller 260.

In addition, in the above description, although the remote plasma unit 250 is always turned on while the film-forming process is performed, it may also be turned on at least before a predetermined time after supply of $O_2$ gas starts (during the first processing gas supply process (S202) or during the purge process (S204)). Also, even after supply of $O_2$ gas is terminated, an on state continues for a predetermined time and then (during the purge process (S208) or during the first processing gas supply process (S202)) the remote plasma unit 250 may be switched off from the on state.

In addition, when there is no need to consider dispersion of the TDMAT gas to the remote plasma unit 250 (for example, a valve is provided between the remote plasma unit 250 and the first gas supply system 243, and the valve may be closed while the TDMAT gas is supplied), in the supply conditions of the TDMAT gas, there is no need to consider whether the TDMAT gas will be plasmatized, and supply conditions in which it can be plasmatized are sufficient. Similarly, when there is no need to consider dispersion of $N_2$ gas to the remote plasma unit 250 (for example, a valve is provided between the remote plasma unit 250 and the third gas supply system 245, and the valve may be closed while $N_2$ gas is supplied), in the supply condition of $N_2$ gas, there is no need to consider whether $N_2$ gas will be plasmatized, and supply conditions in which it can be plasmatized are sufficient.

Second Embodiment

Hereinafter, the second embodiment of the present invention will be described.

A difference between the second embodiment and the first embodiment is the arrangement of the remote plasma unit 250. Hereinafter, only points different from first embodiment will be described and descriptions of the same configurations and processing will be omitted.

Figure 6:
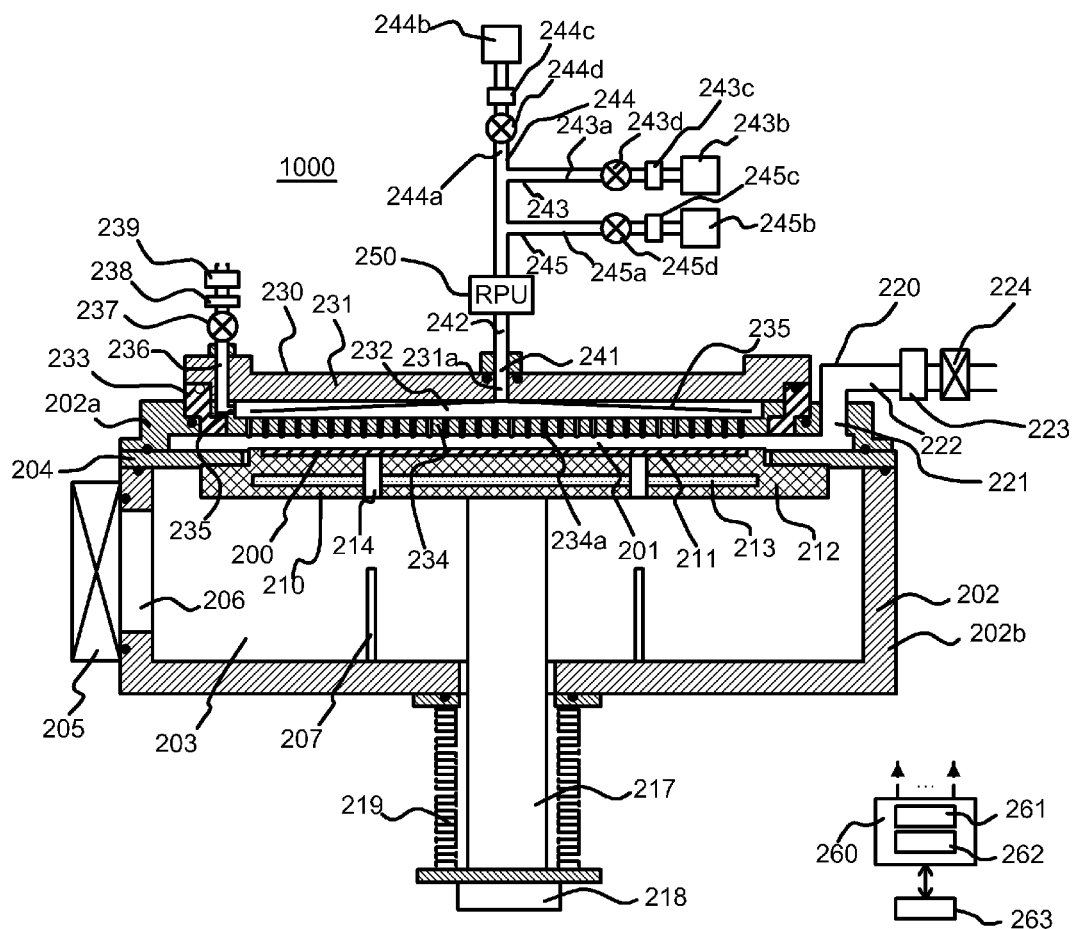
FIG. 6 is a diagram illustrating a substrate processing apparatus according to a second embodiment of the present invention.

FIG. 6 is a diagram illustrating a substrate processing apparatus 1000 according to the second embodiment. In the substrate processing apparatus 1000, the aforementioned first gas supply system 243, second gas supply system 244, and third gas supply system 245 are provided at an upstream side of the remote plasma unit 250.

The film-forming process according to the second embodiment is the same as in FIGS. 3 to 5. That is, the remote plasma unit 250 is always turned on and various gases in order of the TDMAT gas, $N_2$ gas, $O_2$ gas, and $N_2$ gas are supplied to the processing container 202 through the remote plasma unit 250. At this time, the impedance is matched and the plasma is generated only when $O_2$ gas is supplied (only when $O_2$ gas passes the plasma unit 250).

Accordingly, even in the second embodiment, the same effects as in the first embodiment may be obtained.

Third Embodiment

Hereinafter, the third embodiment of the present invention will be described. A difference between the third embodiment and the aforementioned embodiments is a timing of supplying $O_2$ gas. In addition, a configuration of the substrate processing apparatus is the same as in the first embodiment. Hereinafter, only points different from the first embodiment will be described and description of the same configurations and processing will be omitted.

Figure 7:
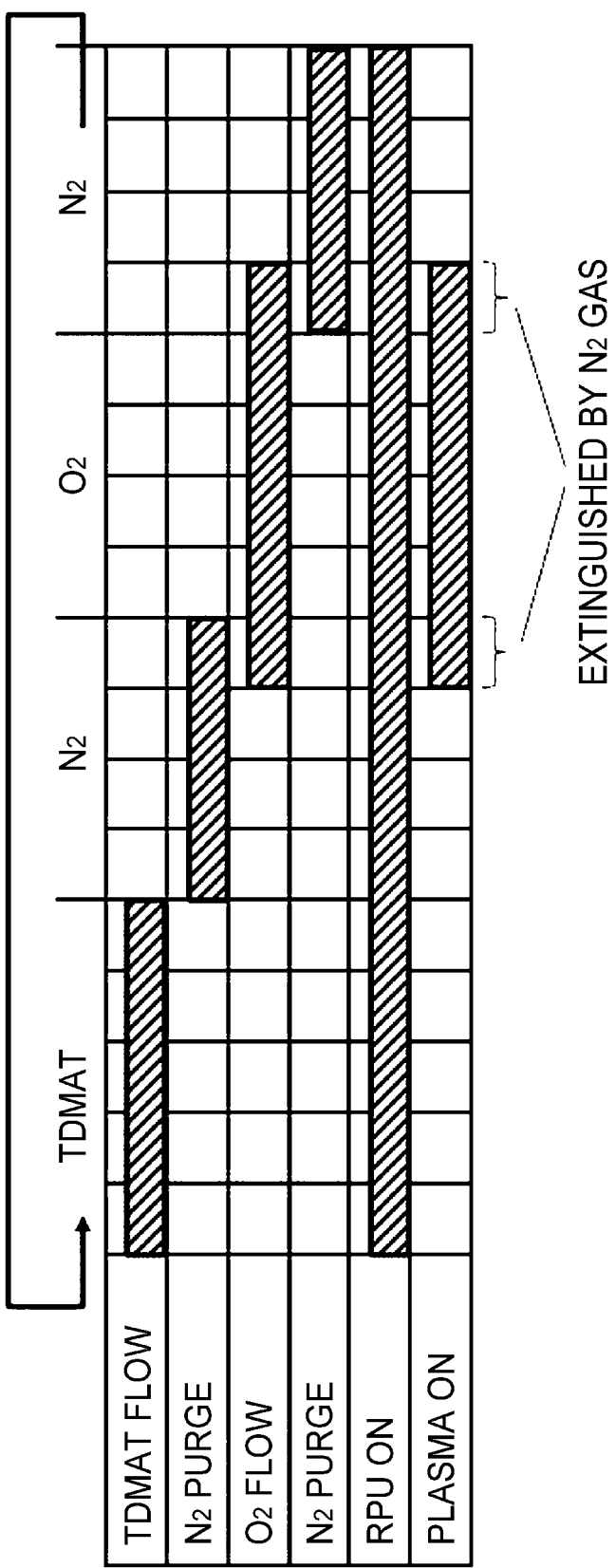
FIG. 7 is a time chart illustrating a film-forming process according to a third embodiment of the present invention.

FIG. 7 is a time chart illustrating a film-forming process according to the third embodiment of the present invention. As illustrated, while the remote plasma unit 250 is always turned on, while $N_2$ gas purge is performed after the TDMAT gas is supplied, the valve 244$d$ is opened and supply of $O_2$ gas starts. In addition, while $O_2$ gas is supplied, the valve 245$d$ is opened and $N_2$ gas purge starts, and while $N_2$ gas purge is performed, the valve 244$d$ is closed and supply of $O_2$ gas is terminated. That is, in the third embodiment, start and termination of S206 in the flowchart illustrated in FIG. 3 temporally overlap with S204 and S208, respectively.

$O_2$ gas is converted into the plasma by the remote plasma unit 250 over a supply period of $O_2$ gas. The plasmatized $O_2$ gas is discharged from the remote plasma unit 250 and then is mixed with $N_2$ gas. Here, a flow rate of $N_2$ gas in purge is set to a flow rate that is sufficient to extinguish the plasma of $O_2$ gas. Accordingly, the plasma of $O_2$ gas is extinguished before reaching the processing container 202. That is, during a period of the $N_2$ purge, $O_2$ gas does not contribute to the film formation.

On the other hand, when the $N_2$ gas purge (S204 in the flowchart illustrated in FIG. 3) is terminated, the plasma of $O_2$ gas is not extinguished, is supplied to the processing container 202, and contributes to the film formation. Also, if the $N_2$ gas purge (S208 in the flowchart illustrated in FIG. 3) starts while $O_2$ gas is supplied, the plasma of $O_2$ gas is extinguished before reaching the processing container 202.

In this way, in the third embodiment, the remote plasma unit 250 is always turned on, supply of $O_2$ gas starts while the $N_2$ gas purge is performed, and supply of $O_2$ gas is terminated while the $N_2$ gas purge is performed. That is, a supply amount (a supply time) of the plasmatized $O_2$ gas is substantially controlled by only opening and closing of the valve 245$d$ configured to supply and stop $N_2$ gas. In this manner, it is possible to perform plasma on and off at a timing synchronized with the flow of the desired $O_2$ gas. In addition, it is possible to control plasma generation by only presence or absence of $N_2$ gas and it is possible to switch plasma on and off at a high speed.

Fourth Embodiment

Hereinafter, the fourth embodiment of the present invention will be described.

Figure 8:
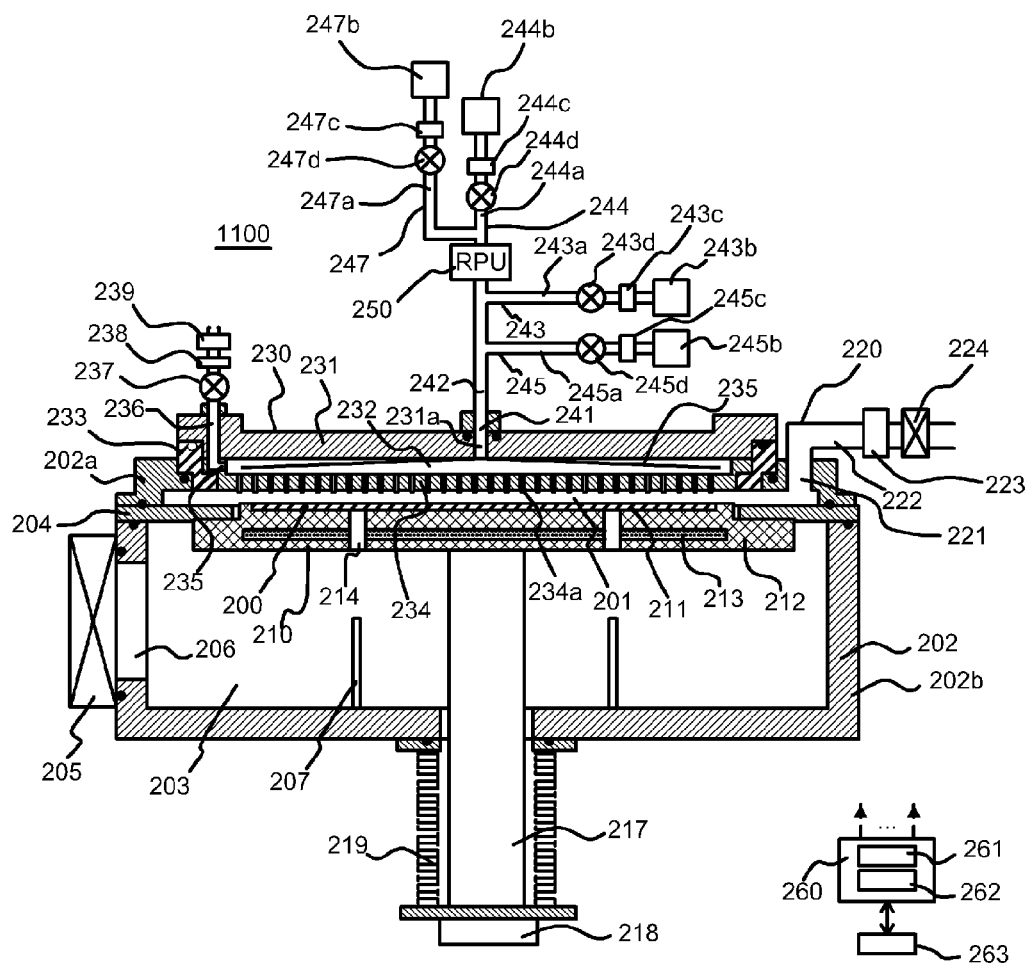
FIG. 8 is a diagram illustrating a substrate processing apparatus according to a fourth embodiment of the present invention.

FIG. 8 is a diagram illustrating a substrate processing apparatus 1100 according to the fourth embodiment. Differences between the substrate processing apparatus 1100 and the substrate processing apparatus 100 according to the first embodiment are providing of a fourth gas supply system 247 and a film-forming process using the same. Hereinafter, only points different from the first embodiment will be described and descriptions of the same configurations and processing will be omitted.

Fourth Gas Supply System 247

As illustrated in FIG. 8, the fourth gas supply system 247 is provided at an upstream side of the remote plasma unit 250. In a fourth gas supply pipe 247a of the fourth gas supply system 247, in order from an upstream end, a fourth gas supply source 247b, a mass flow controller (MFC) 247c serving as a flow rate controller (a flow rate control unit), and a valve 247d serving as an on-off valve are provided.

A GasX is stored in the gas supply source 247b. The GasX passes the mass flow controller 247c and the valve 247d, which are provided in the gas supply pipe 247a, and is supplied to the remote plasma unit 250. The GasX passing the remote plasma unit 250 is introduced into the common gas supply pipe 242 and is supplied to the processing container 202 through the shower head 230.

Here, the term "GasX" refers to a gas that is plasmatized in the remote plasma unit 250 and is a gas (a non-processing gas) that does not contribute to film formation of the wafer 200 (has no reactivity with at least the first processing gas). For example, argon (Ar) may be used as the GasX.

Figure 9:
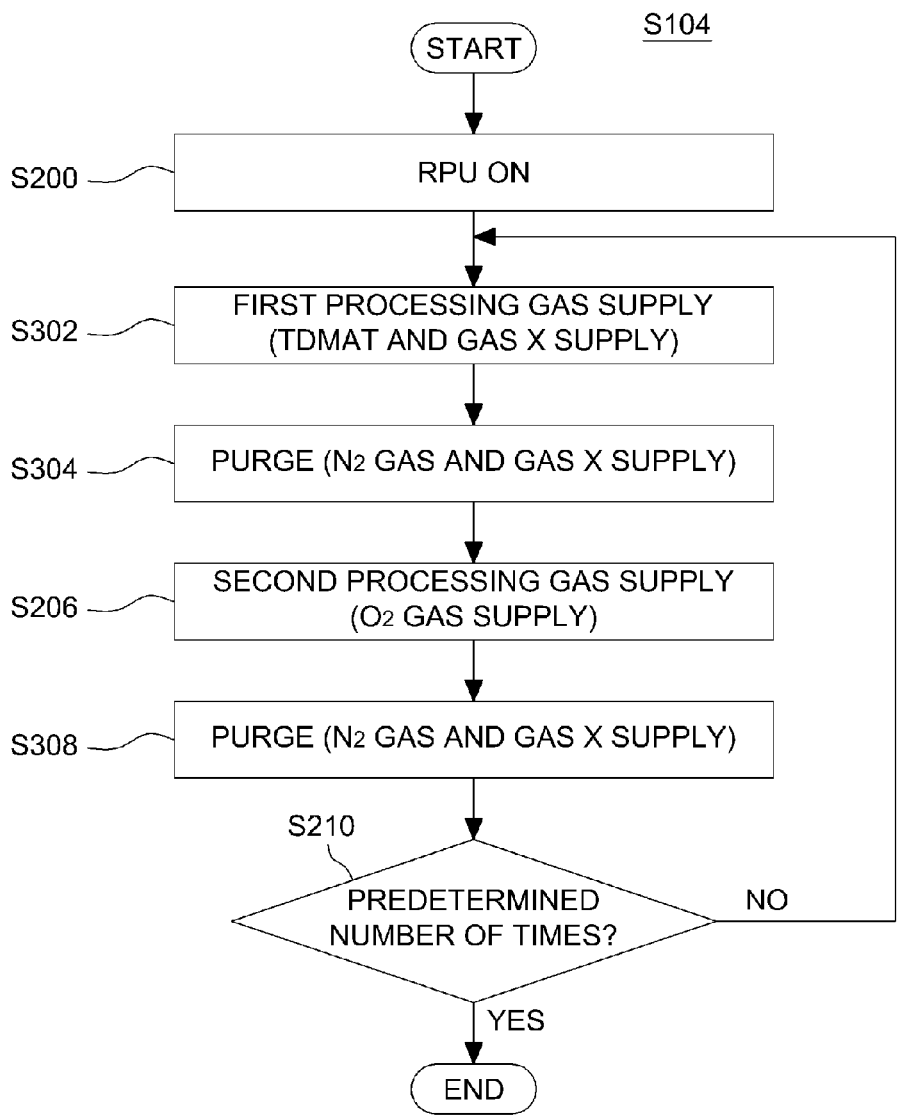
FIG. 9 is a flowchart illustrating a film-forming process according to the fourth embodiment of the present invention.

FIG. 9 is a flowchart illustrating a film-forming process according to the fourth embodiment of the present invention. Hereinafter, description will be provided focusing on differences from the flowchart illustrated in FIG. 3. After the remote plasma unit on process (S200) is performed, in the first processing gas supply process (S302), the TDMAT gas is supplied to the processing container 202, the valve 247d is opened, and the GasX is supplied to the processing container 202 through the remote plasma unit 250. In addition, in the purge process (S304 and S308), $N_2$ gas is supplied to the processing container 202, the valve 247d is opened, and the GasX is supplied to the processing container 202 through the remote plasma unit 250. In addition, only $O_2$ gas is supplied and no GasX is supplied in the second processing gas supply process.

Figure 10:
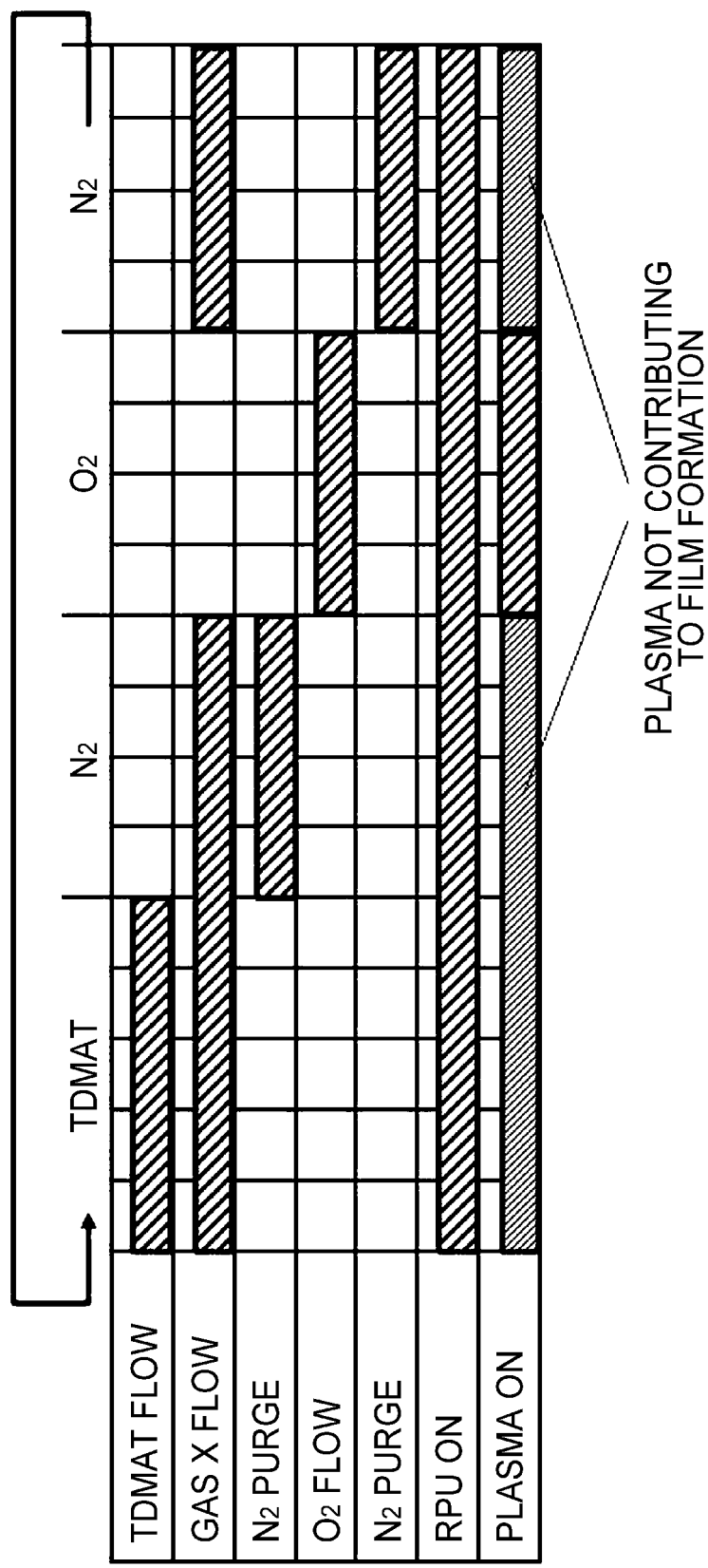
FIG. 10 is a time chart of the film-forming process illustrated in FIG. 9.

FIG. 10 is a time chart of the film-forming process illustrated in FIG. 9. As illustrated in FIG. 10, since the GasX is supplied to the remote plasma unit 250 in the first processing gas supply process (TDMAT Flow) and the purge process ($N_2$ Purge), the remote plasma unit 250 is maintained in a state in which the plasma is always generated. Therefore, when $O_2$ gas is supplied, it is possible to immediately convert the $O_2$ gas into the plasma. In addition, the plasma generated when the GasX is supplied to the remote plasma unit 250 does not contribute to film formation.

In this way, in the fourth embodiment, in addition to the effects obtained in the first embodiment, it is possible to immediately plasmatize $O_2$ gas. Accordingly, it is possible to further improve throughput and precisely define a supply amount and a supply time of the plasmatized processing gas.

Also, each embodiment described above may be appropriately combined. For example, a timing of supplying $O_2$ gas in the second embodiment may also be combined in the third embodiment or the fourth embodiment.

In addition, the present invention may be implemented such that, for example, a gas supply system of an existing substrate processing apparatus in a plant for manufacturing a semiconductor device is modified and a process recipe is changed. In order to change the process recipe, the process recipe according to the present invention is installed in the existing substrate processing apparatus through a telecommunication line or a recording medium recording the process recipe, or an input and output device of the existing substrate processing apparatus is manipulated such that its own process recipe may be changed to the process recipe according to the present invention.

While the film-forming technique has been described above as various typical embodiments of the present invention, the invention is not limited to the embodiments. For example, the present invention may be applied to, for example, a film-forming process in which various films such as a nitride film are formed, or may also be applied to other substrate processes such as a diffusion process, oxidation, nitriding, and a lithography process. In addition, the present invention may also be applied to other substrate processing apparatuses such as a thin film forming apparatus, an etching apparatus, an oxidation apparatus, a nitriding apparatus, a coating apparatus, and a heating apparatus in addition to the annealing processing apparatus.

In a substrate processing apparatus, a non-transitory computer-readable recording medium and a method of manufacturing a semiconductor device according to the present invention, it is possible to switch plasma on and off by securely synchronizing with a flow of a processing gas.

Exemplary Embodiments of the Present Invention

Hereinafter, exemplary embodiments of the present invention will be noted.

Supplementary Note 1

There is provided a substrate processing apparatus configured to process a substrate by alternately supplying a first processing gas and a second processing gas in plasma state to a processing container, the apparatus including: a first gas supply system configured to supply the first processing gas; a second gas supply system configured to supply the second processing gas; a plasma unit disposed at an upstream side of the processing container and configured to plasmatize at least the second processing gas; and a controller configured to control the first gas supply system and the second gas supply system to alternately supply the first processing gas and the second processing gas, and to control a power supply of the plasma unit to apply an electric power to plasmatize the second processing gas before a supply of the second processing gas starts.

Supplementary Note 2

In the substrate processing apparatus of Supplementary note 1, the controller is configured to control the power supply of the plasma unit to apply the electric power continuously even after the supply of the second processing gas is terminated.

Supplementary Note 3

In the substrate processing apparatus of Supplementary note 1 or 2, the controller is configured to control the power supply of the plasma unit to apply the electric power even when none of the first processing gas and the second processing gas is supplied to the plasma unit.

Supplementary Note 4

In the substrate processing apparatus of any one of Supplementary notes 1 to 3, the controller is configured to control the power supply of the plasma unit to apply the electric power constantly while the substrate is processed.

Supplementary Note 5

In the substrate processing apparatus of any one of Supplementary notes 1 to 4, a condition of supplying the first processing gas and the second processing gas includes at least a flow rate, and the condition is set to plasmatize the second processing gas by the plasma unit without plasmatizing the first processing gas.

Supplementary Note 6

The substrate processing apparatus of any one of Supplementary notes 1 to 5 further includes a third gas supply system disposed at an upstream side of the processing container and at a downstream side of the plasma unit and configured to supply an inert gas, wherein the controller is configured to control the third gas supply system to supply the inert gas so as to prevent the first processing gas from being mixed with the second processing gas when the first processing gas and the second processing gas are alternately supplied, and to control the second gas supply system to start the supply of the second processing gas before a supply of the inert gas is terminated.

Supplementary Note 7

In the substrate processing apparatus of Supplementary note 6, the controller is configured to control the second gas supply system and the third gas supply system to terminate and restart the supply of the inert gas while supplying the second processing gas.

Supplementary Note 8

The substrate processing apparatus of any one of Supplementary notes 1 to 5 further includes a fourth gas supply system configured to supply to the plasma unit a non-processing gas incapable of contributing to processing of the substrate, wherein the controller is configured to control the fourth gas supply system to supply the non-processing gas to the plasma unit before the supply of the second processing gas starts.

Supplementary Note 9

In the substrate processing apparatus of Supplementary note 8, a condition of supplying the non-processing gas includes at least a flow rate, and the condition is set to plasmatize the non-processing gas by the plasma unit.

Supplementary Note 10

There is provided a substrate processing apparatus configured to process a substrate by supplying at least a first processing gas and a second processing gas to a processing container, including a first valve configured to open and close a supply path of the first processing gas; a second valve configured to open and close a supply path of the second processing gas; a plasma unit arranged at an upstream side of the processing container and at a downstream side of the second valve; and a controller configured to control opening and closing of the first valve and the second valve such that the first processing gas and the second processing gas are alternately supplied and control a power supply of the plasma unit to apply an electric power to plasmatize the second processing gas before the second valve is opened.

Supplementary Note 11

In the substrate processing apparatus of Supplementary note 10, the controller is configured to control the power supply of the plasma unit to continuously apply the electric power even after the second valve is closed.

Supplementary Note 12

In the substrate processing apparatus of Supplementary note 10 or 11, the first valve is arranged at an upstream side of the plasma unit, a condition of supplying the first processing gas and the second processing gas includes at least a flow rate, and the condition is set to plasmatize the second processing gas without plasmatizing the first processing gas by the plasma unit.

Supplementary Note 13

A method of manufacturing a semiconductor device by alternately supplying a first processing gas and a second processing gas in plasma state by a plasma unit to a processing container includes starting and terminating a supply of the second processing gas while supplying an electric power for plasmatizing the second processing gas to the plasma unit.

Supplementary Note 14

There is provided a method of manufacturing a semiconductor device by processing a substrate by alternately supplying a first processing gas and a second processing gas plasmatized by a plasma unit to a processing container, the method including: starting a supply of an electric power to plasmatize the second processing gas to the plasma unit without supplying the second processing gas to the plasma unit; and starting a supply of the second processing gas with the electric power being supplied to the plasma unit.

Supplementary Note 15

The method of manufacturing a semiconductor device of Supplementary note 14 further includes continuously supplying the electric power to the plasma unit even after the supply of the second processing gas is terminated.

Supplementary Note 16

There is provided a method of manufacturing a semiconductor device including: a first process of supplying a first processing gas to a processing container accommodating a substrate; a second process of supplying an inert gas to the processing container at a downstream side of a plasma unit; a third process of supplying a second processing gas plasmatized by the plasma unit toward the processing container; and a fourth process of supplying an inert gas to the processing container at a downstream side of the plasma unit, wherein, in the third process, a supply of the second processing gas starts before the second process is terminated and a supply of the second processing gas is terminated after the fourth process starts.

Supplementary Note 17

There is provided a method of manufacturing a semiconductor device including: a first process of supplying a first processing gas to a processing container accommodating a substrate; a second process of supplying a second processing gas plasmatized by a plasma unit to the processing container; and a third process of supplying to the plasma unit a non-processing gas incapable of contributing to processing of the substrate in a process other than the second process so as to generate plasma by the plasma unit.

Supplementary Note 18

There is provided a program for processing a substrate by alternately supplying a first processing gas and a second processing gas plasmatized by a plasma unit to a processing container, causing a computer to execute a sequence of starting and terminating a supply of the second processing gas while applying an electric power for plasmatizing the second processing gas to the plasma unit.

Supplementary Note 19

There is provided a program for processing a substrate by alternately supplying a first processing gas and a second processing gas plasmatized by a plasma unit to a processing container, the program causing a computer to execute: starting a supply of an electric power to plasmatize the second processing gas to the plasma unit without supplying the second processing gas to the plasma unit; and starting a supply of the second processing gas with the electric power being supplied to the plasma unit.

Supplementary Note 20

There is provided a non-transitory computer-readable recording medium storing a program for processing a substrate by alternately supplying a first processing gas and a second processing gas plasmatized by a plasma unit to a processing container, the program causing a computer to execute a sequence of starting and terminating a supply of the second processing gas while applying an electric power to plasmatize the second processing gas by the plasma unit.

Supplementary Note 21

There is provided a non-transitory computer-readable recording medium storing a program for processing a substrate by alternately supplying a first processing gas and a second processing gas plasmatized by a plasma unit to a processing container, the program causing a computer to execute: starting a supply of an electric power to plasmatize the second processing gas to the plasma unit without supplying the second processing gas to the plasma unit; and starting a supply of the second processing gas with the electric power being supplied to the plasma unit.

The present invention may be used for a substrate processing apparatus, a non-transitory computer-readable recording medium and a method of manufacturing a semiconductor device by which a substrate is processed.

What is claimed is:

1. A substrate processing apparatus configured to process a substrate by alternately supplying a first processing gas and a second processing gas in plasma state to a processing container, the apparatus comprising:

a first gas supply system configured to supply the first processing gas;
a second gas supply system configured to supply the second processing gas;
a plasma unit disposed at an upstream side of the processing container and configured to plasmatize at least the second processing gas;
a third gas supply system disposed at an upstream side of the processing container and at a downstream side of the plasma unit and configured to supply an inert gas; and
a controller configured to control the first gas supply system and the second gas supply system to alternately supply the first processing gas and the second processing gas, and to control a power supply of the plasma unit to apply an electric power to plasmatize the second processing gas before a supply of the second processing gas starts;
wherein the controller is further configured to control the third gas supply system to supply the inert gas so as to prevent the first processing gas from being mixed with the second processing gas when the first processing gas and the second processing gas are alternately supplied, and to control the second gas supply system to start the supply of the second processing gas before a supply of inert gas is terminated.

2. The apparatus according to claim 1, wherein the controller is configured to control the power supply of the plasma unit to apply the electric power continuously even after the supply of the second processing gas is terminated.

3. The apparatus according to claim 1, wherein the controller is configured to control the power supply of the plasma unit to apply the electric power even when none of the first processing gas and the second processing gas is supplied to the plasma unit.

4. The apparatus according to claim 1, wherein the controller is configured to control the power supply of the plasma unit to apply the electric power constantly while the substrate is processed.

5. The apparatus according to claim 1, wherein a condition of supplying the first processing gas and the second processing gas includes at least a flow rate, and the condition is set to plasmatize the second processing gas by the plasma unit without plasmatizing the first processing gas.

6. The apparatus according to claim 1, wherein the controller is configured to control the second gas supply system and the third gas supply system to terminate and restart the supply of the inert gas while supplying the second processing gas.

7. The apparatus according to claim 1, further comprising a fourth gas supply system configured to supply to the plasma unit a non-processing gas incapable of contributing to processing of the substrate,
wherein the controller is configured to control the fourth gas supply system to supply the non-processing gas to the plasma unit before the supply of the second processing gas starts.

8. The apparatus according to claim 7, wherein a condition of supplying the non-processing gas includes at least a flow rate, and the condition is set to plasmatize the non-processing gas by the plasma unit.

* * * * *